(12) United States Patent
Buck

(10) Patent No.: US 6,445,753 B1
(45) Date of Patent: Sep. 3, 2002

(54) METHOD AND CIRCUIT CONFIGURATION FOR PROCESSING DIGITAL SIGNALS

(75) Inventor: Martin Buck, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/128,807

(22) Filed: Aug. 4, 1998

(30) Foreign Application Priority Data

Aug. 4, 1997 (DE) .......................................... 197 33 733

(51) Int. Cl.[7] .............................................. H04L 27/06
(52) U.S. Cl. ........................................ 375/340; 375/360
(58) Field of Search ................................ 375/340, 285, 375/359, 360, 346, 361; 327/24

(56) References Cited

U.S. PATENT DOCUMENTS

| | | | |
|---|---|---|---|
| 3,659,286 A | * 4/1972 | Perkins et al. | ............... 375/282 |
| 3,970,944 A | 7/1976 | Huellwegen | ................ 327/166 |
| 4,471,235 A | 9/1984 | Sakhuja et al. | ............... 327/34 |
| 4,786,824 A | 11/1988 | Masuda | ........................ 327/76 |
| 5,418,486 A | 5/1995 | Callahan | ..................... 327/310 |
| 6,130,563 A | * 10/2000 | Pilling et al. | ............... 327/437 |

FOREIGN PATENT DOCUMENTS

| | | |
|---|---|---|
| DE | 31 33 667 A1 | 3/1983 |
| EP | 0 009 549 A1 | 4/1980 |
| EP | 0 320 711 A2 | 6/1989 |
| JP | 5-114838 | 7/1993 |
| JP | 5-235713 | 10/1993 |
| JP | 5-308258 | 11/1993 |

OTHER PUBLICATIONS

"Pulse Code Modulation Techniques" (Waggener), ISBN 0-442-1436-8, pp. 291-306.
"Digital Modulation Methods" (Mäusl), ISBN 3-7785-2085, Chapter 3.4.2, pp. 203-207.
Taiwanese Patent Abstract No. 302579 (Hwang), dated Apr. 11, 1992.

* cited by examiner

Primary Examiner—Tesfaldet Bocure
(74) Attorney, Agent, or Firm—Laurence A. Greenberg; Werner H. Stemer; Ralph E. Locher

(57) ABSTRACT

A method and a circuit configuration deactivate an input of a receiving circuit when a first edge occurs, during processing of a digital input signal. When a falling edge occurs, the input is only reactivated after a delay. An influence of signal interference and incorrect interpretations of the signal can thereby be reduced. The method and circuit configuration are employed in particular with clock signals in which only one edge is used for signal evaluation.

12 Claims, 2 Drawing Sheets

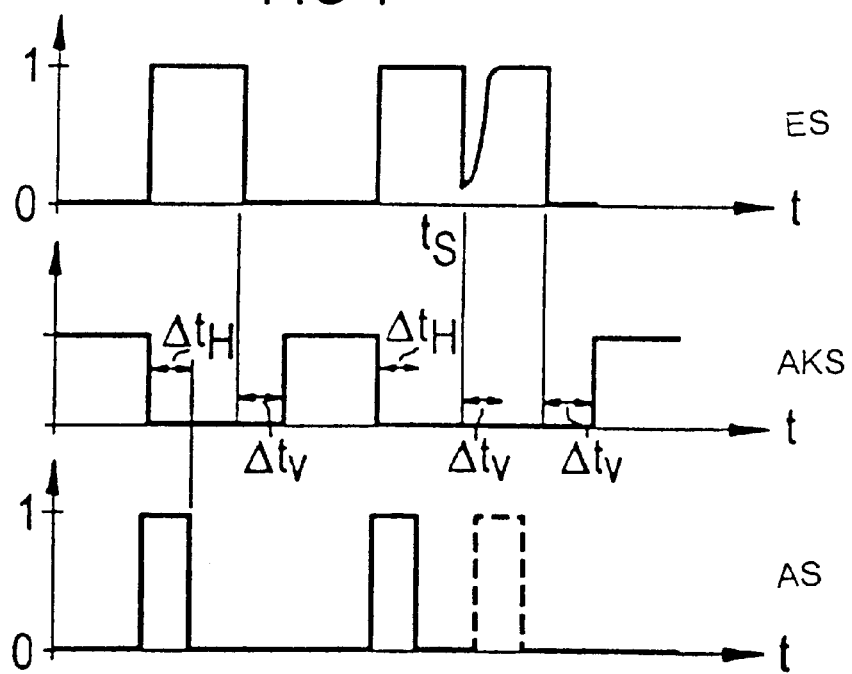
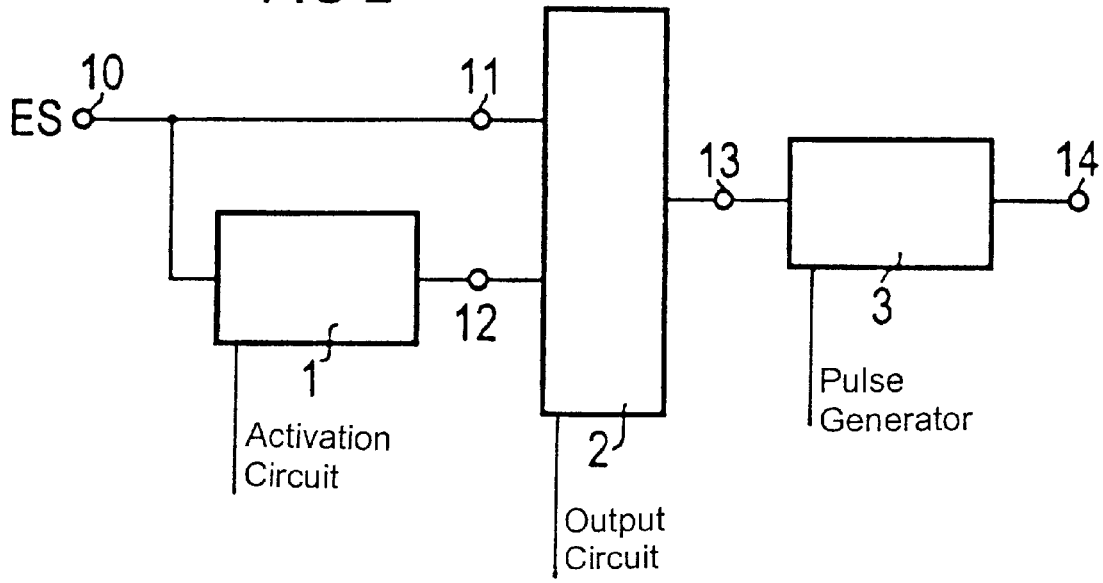

METHOD AND CIRCUIT CONFIGURATION FOR PROCESSING DIGITAL SIGNALS

BACKGROUND OF THE INVENTION

Field of the Invention

The invention relates to a method for processing digital signals, such as clock signals, for example. The invention additionally relates to a circuit configuration for carrying out the method.

It is frequently the case that only edges are evaluated during the processing of digital signals. An edge is understood to mean a change from one logic state to another logic state. The change of a signal from a logic zero to a logic one is referred to as a rising edge, and the change from a logic one to a logic zero is referred to as a falling edge.

Although digital signals have a higher signal-to-noise ratio than analog signals, it is nevertheless possible for erroneous evaluation of the signal content to occur as a result of superposed noise, voltage dips caused by coupling, or settling processes after the edges.

Circuits are known which do not consider a following signal component for a certain period of time after the occurrence of a rising edge. Interference that occurs in that period of time and has a level similar to that of the signal is not evaluated as a useful signal.

In that case, the period of time is shorter than the period of time between two successive rising edges of a signal without any interference. It must be as short as required by the maximum clock rate.

A disadvantage of those circuits is the fact that the period of time in which the signal component remains unconsidered is constant and must be dimensioned in such a way that a useful signal is reliably identified even at high clock rates, that is to say short time intervals between two edges. That means, however, that when the clock rate is less than the maximum clock rate, that period of time is significantly shorter than the time interval between two edges. The insusceptibility to interference is thus greatly dependent on the clock rate. It is greatest at the maximum clock rate.

SUMMARY OF THE INVENTION

It is accordingly an object of the invention to provide a method for processing digital signals and a circuit configuration for carrying out the method, which overcome the hereinafore-mentioned disadvantages of the heretofore-known methods and devices of this general type and which provide a high, constant protection against interference signals at different clock rates of the digital signal.

With the foregoing and other objects in view there is provided, in accordance with the invention, a method for processing a digital input signal, which comprises assuming a first state of an activation signal upon an occurrence of a first edge of an input signal, and maintaining the first state at least for a predetermined holding time; assuming a second state of the activation signal differing from the first state after a delay of a predetermined delay time, upon an occurrence of a second edge of the input signal occurring after the holding time and differing from the first edge; and deriving a digital output signal from the input signal only when the activation signal is in the second state.

In accordance with another mode of the invention, there is provided a method which comprises selecting the first edge of the input signal as a rising edge.

In accordance with a further mode of the invention, there is provided a method which comprises selecting the input signal as a periodic clock signal.

In accordance with an added mode of the invention, there is provided a method which comprises setting a time duration of a logic state of the output signal to be shorter than a time duration between the first and second edges of the input signal.

In accordance with an additional mode of the invention, there is provided a method which comprises setting the time duration of the logic state of the output signal to be constant.

With the objects of the invention in view there is also provided a circuit configuration for processing a digital input signal, comprising an activation circuit having an input side for receiving an input signal and an output side for supplying an activation signal, the activation circuit immediately changing an instantaneous state of the activation signal in the event of a rising edge of the input signal, then maintaining the instantaneous state at least for a duration of a holding time, and changing the instantaneous state in the event of a falling edge after a delay by a delay time; and an output circuit having a first input for receiving the input signal, a second input for receiving the activation signal and an output, the output circuit forwarding the input signal to the output only in the event of a specific state of the activation signal.

In accordance with another feature of the invention, there is provided a pulse generator connected downstream of the output circuit.

In accordance with a further feature of the invention, the activation circuit includes a delay device having a non-inverting output, an inverting output and an input; a first NAND gate having an output connected to the input of the delay device, one input forming an input of the activation circuit and a further input; a second NAND gate having one input connected to the input of the delay device, a further input connected to the inverting output of the delay device and an output connected to the further input of the first NAND gate; and a NOR gate having one input connected to the input of the delay device, a further input connected to the non-inverting output of the delay device and an output forming an output of the activation circuit.

In accordance with an added feature of the invention, the output circuit includes an inverter having transistors with complementary circuitry, an input for receiving the digital input signal and an output; one transistor having a channel side connected between the output of the inverter and a reference potential, the one transistor having a gate for receiving the activation signal; and another transistor of a different conduction type from the one transistor, the other transistor connected between another reference potential and one of the transistors of the inverter, the other transistor having a gate for receiving the activation signal.

In accordance with an additional feature of the invention, the pulse generator includes a delay circuit, and a NAND gate having one input receiving the output signal directly and another input receiving the output signal time-delayed by the delay circuit.

In accordance with a concomitant feature of the invention, the delay device and/or the delay circuit has a series circuit of inverters.

The method according to the invention is suitable for digital signals in which only one edge, for example the rising edge, is used for evaluation.

The method according to the invention has the advantage of ensuring that the interference immunity does not depend on the clock rate of the digital signal. Moreover, it can be used both for periodic and for non-periodic digital signals.

Other features which are considered as characteristic for the invention are set forth in the appended claims.

Although the invention is illustrated and described herein as embodied in a method and a circuit configuration for processing digital signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a group of signal diagrams for elucidating the method according to the invention;

FIG. 2 is a block diagram of the circuit configuration according to the invention;

DESCRIPTION OF THE PREFERRED EMBODIMENTS

Figure 3:
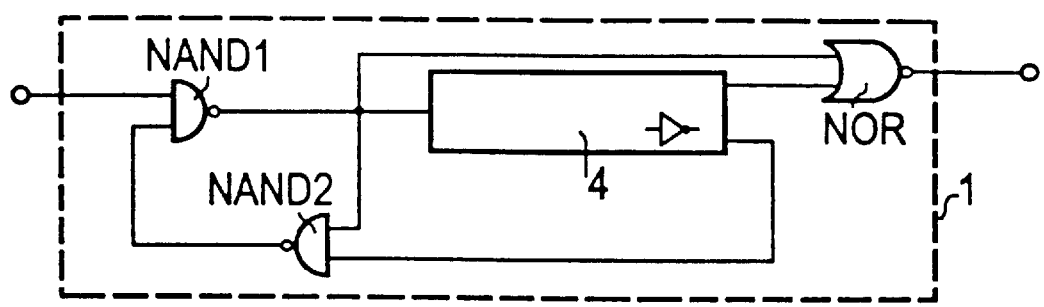
FIG. 3 is a schematic diagram of an embodiment of an activation circuit.

Referring now to the figures of the drawings in detail and first, particularly, to FIG. 1 thereof, there is seen a digital input signal ES, an activation signal AKS and a digital output signal AS which are plotted against time t in a signal diagram. If a rising edge occurs in a time profile of the input signal ES, then the activation signal AKS changes from an active state to a passive state. Changes in the input signal ES can be taken over by the output signal AS only if the activation signal AKS is in the active state. During the passive state of the activation signal AKS, changes in the input signal ES remain ineffective for the output signal AS.

Since, according to FIG. 1, the activation signal AKS is still in the active state at the instant when the rising edge occurs, the output signal AS takes over the rising edge.

If the rising edge of the input signal ES is followed by a falling edge, then the activation signal AKS still remains in the passive state for a delay time Dt, before it returns to the active state. Thus, after a falling edge of the input signal ES, the active state is reached after a delay by the delay time $Dt_V$, which proceeds starting at the instant when the falling edge of the input signal ES occurs. The instant at which the delay time Dt, begins to proceed can occur at the earliest after a holding time $Dt_H$ has elapsed after the instant when the rising edge of the input signal ES occurred. Consequently, the minimum duration of the passive state is the sum of delay time $Dt_V$ and holding time $Dt_H$.

When the input signal ES changes from the logic state one to the logic state zero, the activation signal AKS goes into the active state after the delay time $Dt_V$. The output signal AS thereupon takes over the logic state zero of the input signal ES.

If interference which is evaluated as a falling edge is superposed on the input signal ES while it is in the logic state one, then the activation signal AKS only assumes the active state if the input signal ES is in the logic state zero after the delay time $Dt_V$ has elapsed. Thus, interference having a temporal appearance which is shorter than the delay time $Dt_V$ is identified as such.

The values for the delay time $Dt_V$ and the holding time $Dt_H$ may be determined empirically. In this case, the delay time $Dt_V$ must be shorter than the shortest occurring duration of a logic state zero and the holding time $Dt_H$ must be shorter than the shortest occurring duration of a logic state one of the input signal ES.

After the rising edge, the output signal AS remains, for example, at the logic state one for a specific time of constant duration, with the result that a pulsed output signal AS is produced. However, it is also possible for it to assume the logic state zero again only when the input signal ES has assumed the logic state zero and the activation signal AKS is in the active state.

In the signal diagram according to FIG. 1, the logic state one is portrayed as the active state and the logic state zero is portrayed as the passive state. The output signal AS has a pulsed character in this case. The dashed pulse of the output signal AS would be produced if an interference signal is superposed on the input signal ES at an instant $t_s$ and the method according to the invention is not employed.

The signal diagram according to FIG. 1 shows a non-periodic input signal ES. The method according to the invention operates equally for periodic input signals ES having any desired clock ratio. It is clear to a person skilled in the art that the method according to the invention also operates with an inverted signal. For example, the passive state of the activation signal AKS can also follow a falling edge of the input signal ES. The active state is then adapted, after the delay time $Dt_V$, to a rising edge of the input signal ES.

FIG. 2 illustrates a block diagram of a possible circuit configuration for carrying out the method according to the invention. The input signal ES of an activation circuit 1 and of an output circuit 2 can be fed in at an input 10 of the circuit configuration. An output of the activation circuit 1 is connected to an input 12 of the output circuit 2. The output signal AS can be tapped at an output 13 of the output circuit 2.

According to a further embodiment of the circuit configuration a pulse generator 3 is connected downstream of the output circuit 2. In this embodiment, an output 14 of the pulse generator 3 corresponds to an output of the circuit configuration.

According to a possible embodiment of the activation circuit 1 which is illustrated in FIG. 3, the activation circuit 1 includes a delay device 4 having an input that is connected to an output of a first NAND gate NAND1, to an input of a second NAND gate NAND2 and to an input of a NOR gate NOR. In addition to its input, the delay device 4 has a non-inverting output and an inverting output. The non-inverting output is connected to a further input of the NOR gate NOR, and the inverting output is connected to a further input of the second NAND gate NAND2.

An output of the NOR gate NOR corresponds to the output of the activation circuit 1. One input of the first NAND gate NAND1 is connected to an input of the activation circuit 1, which corresponds to the input 10 of the circuit configuration. A further input of the first NAND gate NAND1 is connected to an output of the second NAND gate NAND2.

The input signal ES can be fed to the input of the activation circuit 1. The activation signal AKS is present at the output of the activation circuit 1. The delay device 4 is connected to the logic gates NAND1, NAND2 and NOR in such a way that in the event of a rising edge of the input signal ES, the activation signal AKS follows the input signal ES immediately, but in the event of a falling edge of the input signal ES, the activation signal AKS follows the input signal ES with a delay by the delay time $Dt_v$. A signal change at the input of the activation circuit 1 has no influence on the activation signal AKS for the duration of the holding time $Dt_H$. It is only a falling edge of the input signal ES that occurs after the holding time $Dt_H$ which returns the activation signal AKS to the active state.

The delay device 4 may be constructed, for example, as a series circuit of invertors. If the individual invertors are constructed by using complementary MOS logic (CMOS), then the respective value for the delay time $Dt_v$ and the holding time $Dt_H$ can be predetermined by the choice of length and width of the channel of the MOS transistors, in particular from the ratio of length and width.

Figure 4:
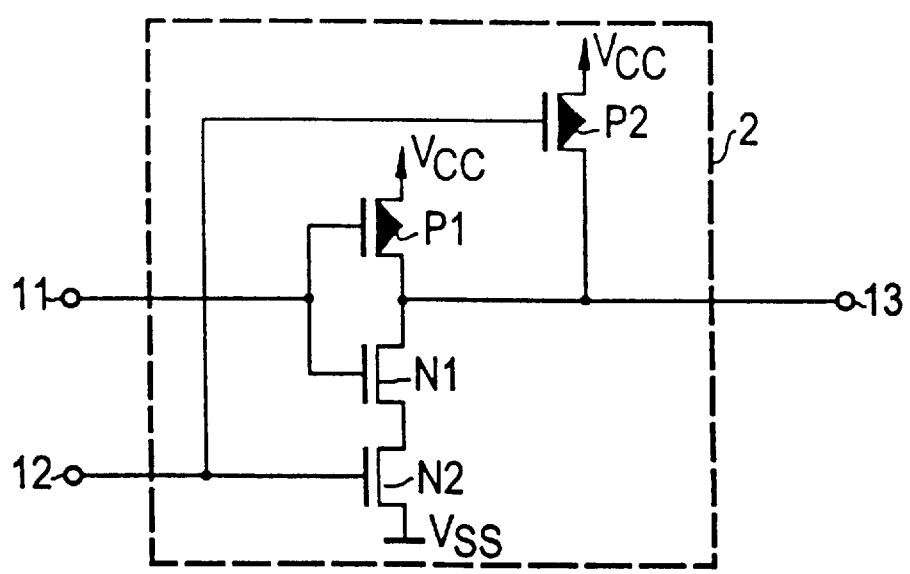
FIG. 4 is a schematic diagram of an embodiment of an output circuit.

The output circuit 2 evaluates the input signal ES at an input 11 and the activation signal AKS at the input 12 of the output circuit. FIG. 4 shows a circuit diagram of an advantageous embodiment of the output circuit 2. The input 11 of the output circuit is connected to an input of an invertor N1, P1. The inverter N1, P1 is constructed of a first transistor P1 of a first conduction type and a first transistor N1 of a second conduction type, using complementary circuitry. An output of the invertor N1, P1 forms the output 13 of the output circuit 2. A second transistor N2 of the second conduction type is connected between the first transistor N1 of the second conduction type and a first reference potential $V_{SS}$. A channel side of a second transistor P2 of the first conduction type is connected between a second reference potential $V_{CC}$ and the output 13 of the output circuit. Gate terminals of the second transistor P2 of the first conduction type and the second transistor N2 of the second conduction type are respectively connected to the input 12 of the output circuit.

The input signal ES at the input 11 is forwarded to the output 13 of the output circuit only when the activation signal AKS at the input 12 has a state such that the second transistor N2 of the second conduction type is switched on and the second transistor P2 of the first conduction type is switched off. Otherwise, the output 13 of the output circuit assumes the second reference potential $V_{CC}$ irrespective of a signal at the input 11.

Figure 5:
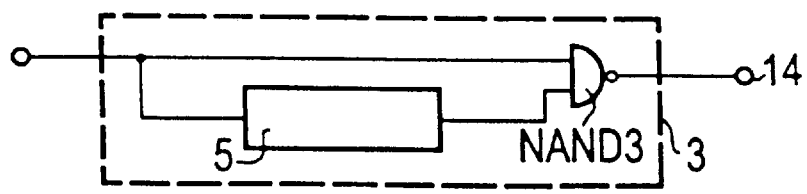
FIG. 5 is a schematic diagram of an embodiment of a pulse generator.

The pulse generator 3 can be provided downstream of the output circuit 2 in order to obtain a pulsed output signal AS having a constant pulse duration, as is desirable for many applications. A possible structure of a pulse generator 3 is illustrated in FIG. 5. The pulse generator 3 has a third NAND gate NAND3. One input of the third NAND gate NAND3 receives the output signal AS from the output 13 of the output circuit 2 directly. Another input of the third NAND gate NAND3 receives an inverted output signal AS, time-delayed by a delay circuit 5. The pulsed output signal AS is present at the terminal 14. The structure of the delay circuit 5 may be identical to the structure of the delay unit 4.

It is clear to a person skilled in the art that one or more invertors can be provided in each case both upstream and downstream of the activation circuit 1, of the output circuit 2 and of the pulse generator 3. This is done in order to increase the driver power or to adapt the circuit configuration from a negative logic to a positive logic in which the rising edges are the edges of interest.

The method according to the invention as well as the circuit configuration according to the invention are employed in particular wherever clock signals have to be evaluated without any errors in spite of interference influences and noise.

I claim:

1. A method for processing a digital input signal, which comprises:

assuming a first state of an activation signal upon an occurrence of a first edge of an input signal, and maintaining the first state at least for a predetermined holding time;

assuming a second state of the activation signal differing from the first state after a delay of a predetermined delay time, upon an occurrence of a second edge of the input signal occurring after the holding time and differing from the first edge; and deriving a digital output signal from the input signal only when the activation signal is in the second state.

2. The method according to claim 1, which comprises selecting the first edge of the input signal as a rising edge.

3. The method according to claim 1, which comprises selecting the input signal as a periodic clock signal.

4. The method according to claim 1, which comprises setting a time duration of a logic state of the output signal to be shorter than a time duration between the first and second edges of the input signal.

5. The method according to claim 4, which comprises setting the time duration of the logic state of the output signal to be constant.

6. A circuit configuration for processing a digital input signal, comprising:

an activation circuit having an input side for receiving an input signal and an output side for supplying an activation signal, said activation circuit immediately changing an instantaneous state of the activation signal in the event of a rising edge of the input signal, then maintaining the instantaneous state at least for a duration of a holding time, and changing the instantaneous state in the event of a falling edge after a delay by a delay time; and an output circuit having a first input for receiving the input signal, a second input for receiving the activation signal and an output, said output circuit forwarding the input signal to said output only in the event of a specific state of the activation signal.

7. The circuit configuration according to claim 6, including a pulse generator connected downstream of said output circuit.

8. The circuit configuration according to claim 6, wherein said activation circuit includes:

a delay device having a non-inverting output, an inverting output and an input;

a first NAND gate having an output connected to said input of said delay device, one input forming an input of said activation circuit and a further input;

a second NAND gate having one input connected to said input of said delay device, a further input connected to said inverting output of said delay device and an output connected to said further input of the first NAND gate; and a NOR gate having one input connected to said input of said delay device, a further input connected to said non-inverting output of said delay device and an output forming an output of said activation circuit.

9. The circuit configuration according to claim 6, wherein said output circuit includes:

an inverter having transistors with complementary circuitry, an input for receiving the digital input signal and an output;

one transistor having a channel side connected between said output of said inverter and a reference potential, said one transistor having a gate for receiving the activation signal; and another transistor of a different conduction type from said one transistor, said other transistor connected between another reference potential and one of said transistors of said inverter, said other transistor having a gate for receiving the activation signal.

10. The circuit configuration according to claim 7, wherein said pulse generator includes a delay circuit, and a NAND gate having one input receiving the output signal directly and another input receiving the output signal time-delayed by said delay circuit.

11. The circuit configuration according to claim 8, wherein said delay device has a series circuit of invertors.

12. The circuit configuration according to claim 10, wherein said delay circuit has a series circuit of inverters.

* * * * *